Figure 1:
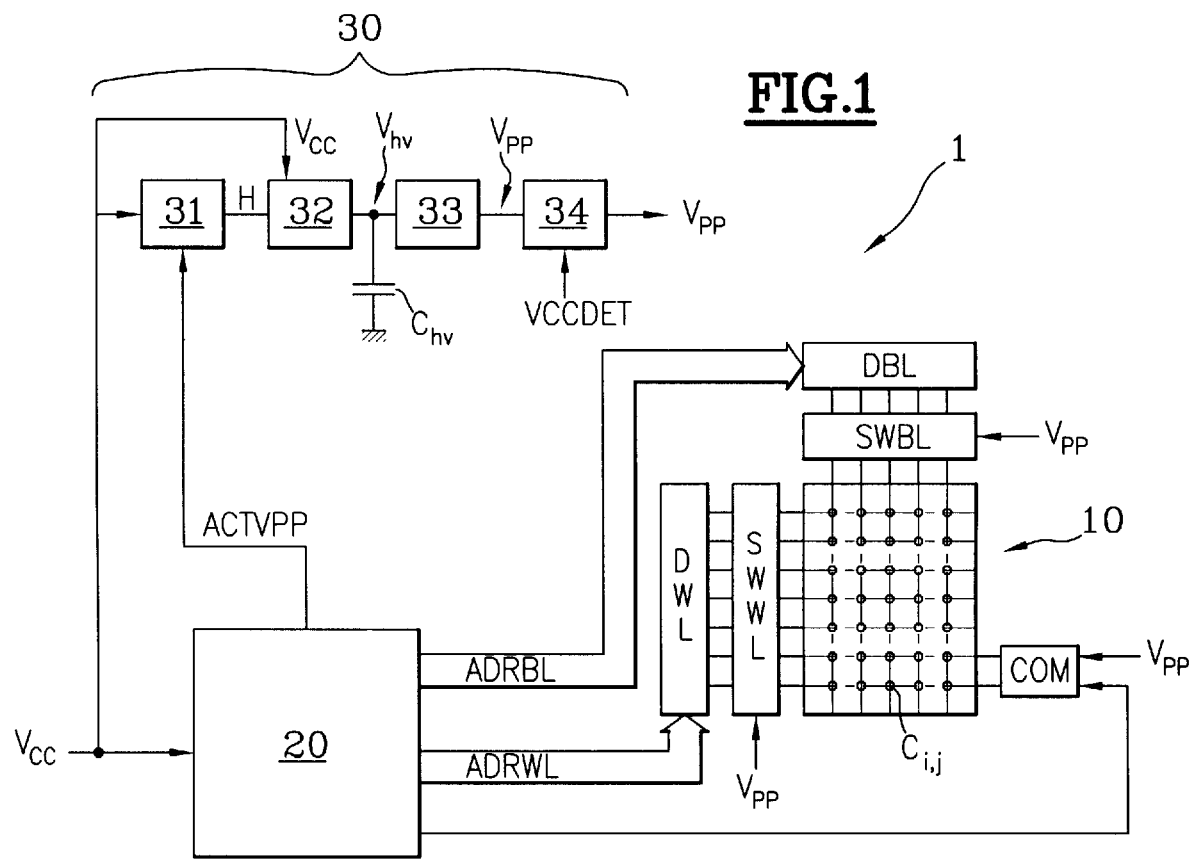

United States Patent [19]

Kowalski et al.

[11] Patent Number: 6,038,190

[45] Date of Patent: Mar. 14, 2000

[54] ELECTRICALLY ERASABLE AND PROGRAMMABLE NON-VOLATILE MEMORY PROTECTED AGAINST POWER SUPPLY FAILURE

[75] Inventors: Jacek Kowalski, Trets; Michel Martin, Rognes, both of France

[73] Assignee: Inside Technologies, Saint Clément les Places, France

[21] Appl. No.: 09/207,001

[22] Filed: Dec. 7, 1998

Related U.S. Application Data

[63] Continuation of application No. PCT/FR97/00922, May 27, 1997.

[30] Foreign Application Priority Data

Jun. 7, 1996 [FR] France .................................. 96 07462

[51] Int. Cl.[7] ................................................ G11C 16/06
[52] U.S. Cl. .......................................... 365/228; 365/218
[58] Field of Search .................................... 365/218, 228, 365/189.01, 230.01, 226

[56] References Cited

U.S. PATENT DOCUMENTS

| | | | |
|---|---|---|---|
| 5,267,218 | 11/1993 | Elbert | 365/226 |
| 5,371,709 | 12/1994 | Fisher et al. . | |

FOREIGN PATENT DOCUMENTS

| | | |
|---|---|---|
| 0 265 312 | 4/1988 | European Pat. Off. . |
| 0 376 290 | 7/1990 | European Pat. Off. . |
| 0 598 475 | 5/1994 | European Pat. Off. . |
| 07248977 | 9/1995 | Japan . |

OTHER PUBLICATIONS

Search Report dated Sep. 10, 1997 from related PCT application PCT/FR 97/00922.

*Primary Examiner*—Terrell W. Fears
*Attorney, Agent, or Firm*—Akin, Gump, Strauss, Hauer & Feld, L.L.P.

[57] ABSTRACT

To reduce the risks of erroneous data writing into an electrically erasable and programmable non-volatile memory (10) (EEPROM) when a failure in the memory (10) voltage supply (Vcc) occurs during a programming or erasing operation, the memory (10) comprising means (30) of generating programming or erasing high voltage (Vpp), means ($SW_i$, $TI_i$) are provided for maintaining the high voltage (Vpp) supply to the cells ($C_{i,j}$) of the memory and capacity (Chv, $CR_2$) of sufficient power to maintain the high voltage (Vpp) during the time required for the programming or erasing operation. The invention is useful particularly for EEPROM memories mounted on chip cards and electronic labels.

18 Claims, 4 Drawing Sheets

ELECTRICALLY ERASABLE AND PROGRAMMABLE NON-VOLATILE MEMORY PROTECTED AGAINST POWER SUPPLY FAILURE

This application is a continuation of Ser. No. PCT/FR97/00922 filed May 27, 1997.

The present invention relates to EEPROM, that is electrically erasable and programmable non-volatile memories.

EEPROM memories have known an important development last years, due to their advantageous characteristics. In fact, these memories can be programmed and erased at will by applying a high voltage generally called Vpp. Once programmed or erased, they keep information indefinitely without power supply. Due to these characteristics, EEPROM memories represent a preferred means for storing information or transaction data into microcircuits mounted on portable supports which are not provided with own power supply, like chip cards and electronic labels which are electrically supplied only when used.

FIG. 1 shows schematically the structure of a microcircuit 1 of the above-mentioned type, provided with an EEPROM memory 10 comprising a plurality of memory cells $C_{i,j}$ arranged in rows and columns. The microcircuit further comprises a logic circuit 20 (comprising wired logic or microprocessor) and a chain 30 of elements which allow, from a supply voltage Vcc of about 3 to 5V of the microcircuit 1, the generation of the high voltage Vpp necessary for the erasing or programming operations of the memory 10. The chain 30 which produces the high voltage Vpp comprises, arranged in series, a booster circuit, for example a charge pump 32 driven by a clock signal H provided by an oscillator 31, a stabilising capacity Chv, a voltage regulator 33 and a shaping circuit 34 of the voltage Vpp.

When an erasing or programming operation has to be performed, the logic circuit 20 applies an activation signal ACTVPP to the oscillator 31 and the charge pump 32 provides a high voltage Vhv of about 22 to 25 volts from the voltage Vcc. The voltage Vhv is applied to the stabilising capacity Chv and to the input of the regulator 33 whose output provides the voltage Vpp, of about 15 to 20 volts. At the end of the chain 30, the shaping circuit 34 applies progressively the voltage Vpp to the memory cells $C_{i,j}$ in the form of a ramp which can be seen in FIG. 2.

In the memory 10, the cells $C_{i,j}$ are selected by means of a row decoder DWL and a column decoder DBL receiving respectively addresses ADRWL and ADRBL sent by the logic circuit 20. For programming (setting to "0") or erasing (setting to "1") the cells $C_{i,j}$, the high voltage Vpp is fed to the cells $C_{i,j}$ by means of a first group of switches SWWL driven by the row decoder DWL and a second group of switches SWBL driven by the column decoder DBL. The voltage Vpp is also forwarded to other internal nodes of the memory 10 by means of an operation selection circuit COM controlled by the logic circuit 20, enabling to choose between a programming or erasing operation.

In order that a programming or erasing operation takes place accurately, it is necessary that the high voltage Vpp should be maintained during a certain time, about 4 to 5 ms, necessary for the transfer of electrical charges to the memory cells $C_{i,j}$. Now, the problem in using EEPROM memories in chip card or electronic label microcircuits is that the supply voltage Vcc, from which the high voltage Vpp is generated, can be cut off at any moment due to a user's manipulation mistake (for example, the fact of taking off suddenly a chip card out of the reader into which it is inserted) or due to a bad transmission of energy, particularly when the voltage Vcc is transmitted by electromagnetic induction (contactless chip cards). If by coincidence or by fraud attempt a failure of the supply voltage Vcc takes place during the few milliseconds required by a writing operation, data in the process of being stored present the risk of not being stored or of being stored with aberrations. This problem is particularly embarrassing when data being stored represent monetary value.

In the state of the art, this problem is tolerated as a drawback inherent in the use of EEPROM memories in microcircuits having no autonomous power supply, the process adopted in the case of supply voltage failure merely consisting in setting to zero (Reset) the logic circuit 20 of the microcircuit 1 without taking care of the memory. The French patent 2 703 501 provides however to add an auxiliary cell to each row of an EEPROM memory to prevent the writing of aberrant data during a supply voltage failure. However, this solution refers specifically to unit down counting according to the method called "of the counting frame" and does not solve the general above-mentioned problem.

Thus, the objet of the present invention is to protect EEPROM memories against the risk of writing erroneous data in the case of inopportune failure of the supply voltage.

To achieve this purpose, the present invention is based first of all on noting that, in an EEPROM memory, the programming or erasing operations of the memory cells are performed with an insignificant current consumption. For example, in an EEPROM memory designed with floating gate MOS transistors, the voltage Vpp is applied between the gate G and the drain D of the MOS transistors, these two electrodes being isolated one from another.

Thus, a first idea of the present invention is to maintain the voltage Vpp during the time necessary for a programming or an erasing operation. It is technically possible to perform such a maintaining, for example by means of capacitive elements, due to the fact noted above. Another idea of the present invention is to maintain the path forwarding the high voltage to the memory cells when the supply voltage is cut off. In fact, the applicant has noted that, in conventional EEPROM memories, cutting off the supply voltage Vcc implies the breaking of the electrical paths forwarding the voltage Vpp to the cells in the process of being programmed or erased.

More particularly, the present invention provides an electrically programmable and erasable memory comprising means for producing a programming or erasing high voltage from a supply voltage, means for maintaining the path forwarding the high voltage to the memory cells in the process of being programmed or erased in the case of supply voltage failure, and an electrical capacity able to hold the high voltage.

According to one embodiment, the means for maintaining the path forwarding the high voltage to the cells in the process of being programmed or erased comprise memory switches fed by the high voltage, whose outputs control high voltage forwarding transistors, memory cells selecting transistors, and ground connecting transistors.

Advantageously, the capacity able to maintain the high voltage comprises a stabilising capacity which is present in the high voltage production means.

Advantageously, when the high voltage is applied by means of a ramp generating circuit, the memory comprises means for inhibiting the ramp generating circuit in the case of supply voltage failure.

The present invention relates also to a method of reducing the risks of writing erroneous data into an electrically programmable and erasable memory when a supply voltage failure occurs during a programming or erasing operation of memory cells, the memory comprising means for producing a programming or erasing high voltage, the method comprising steps consisting in maintaining the path forwarding the high voltage to the memory cells when the supply voltage is missing, and in maintaining the high voltage during the time necessary to the programming or erasing operation.

Figure 2:
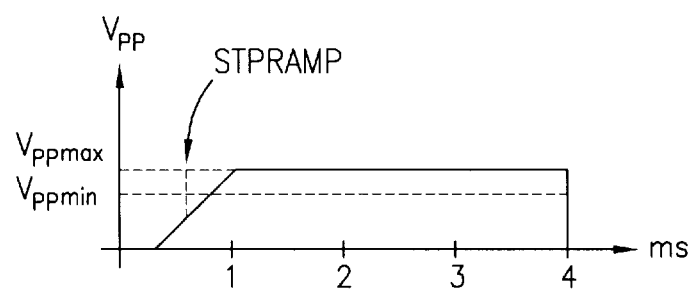
Figure 4:
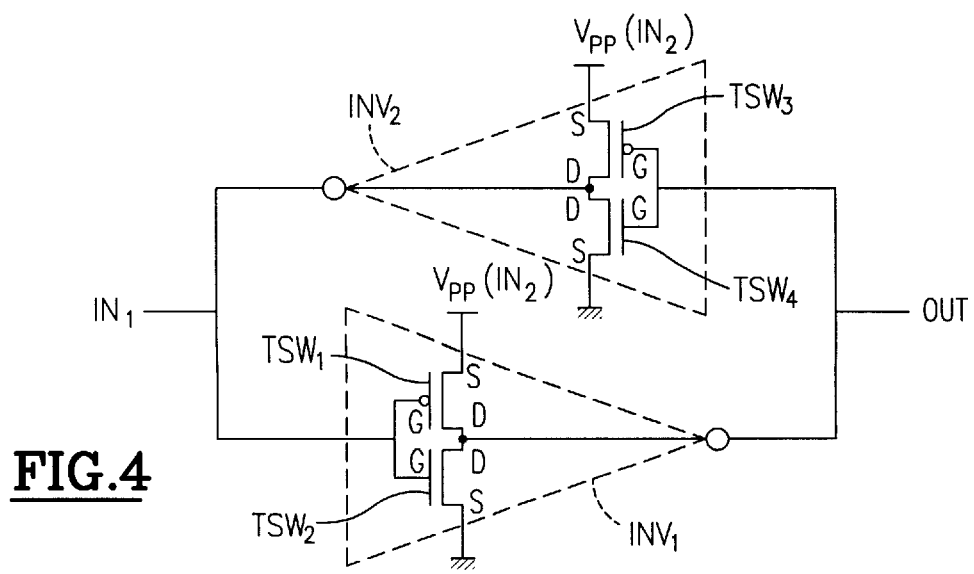
Figure 3:
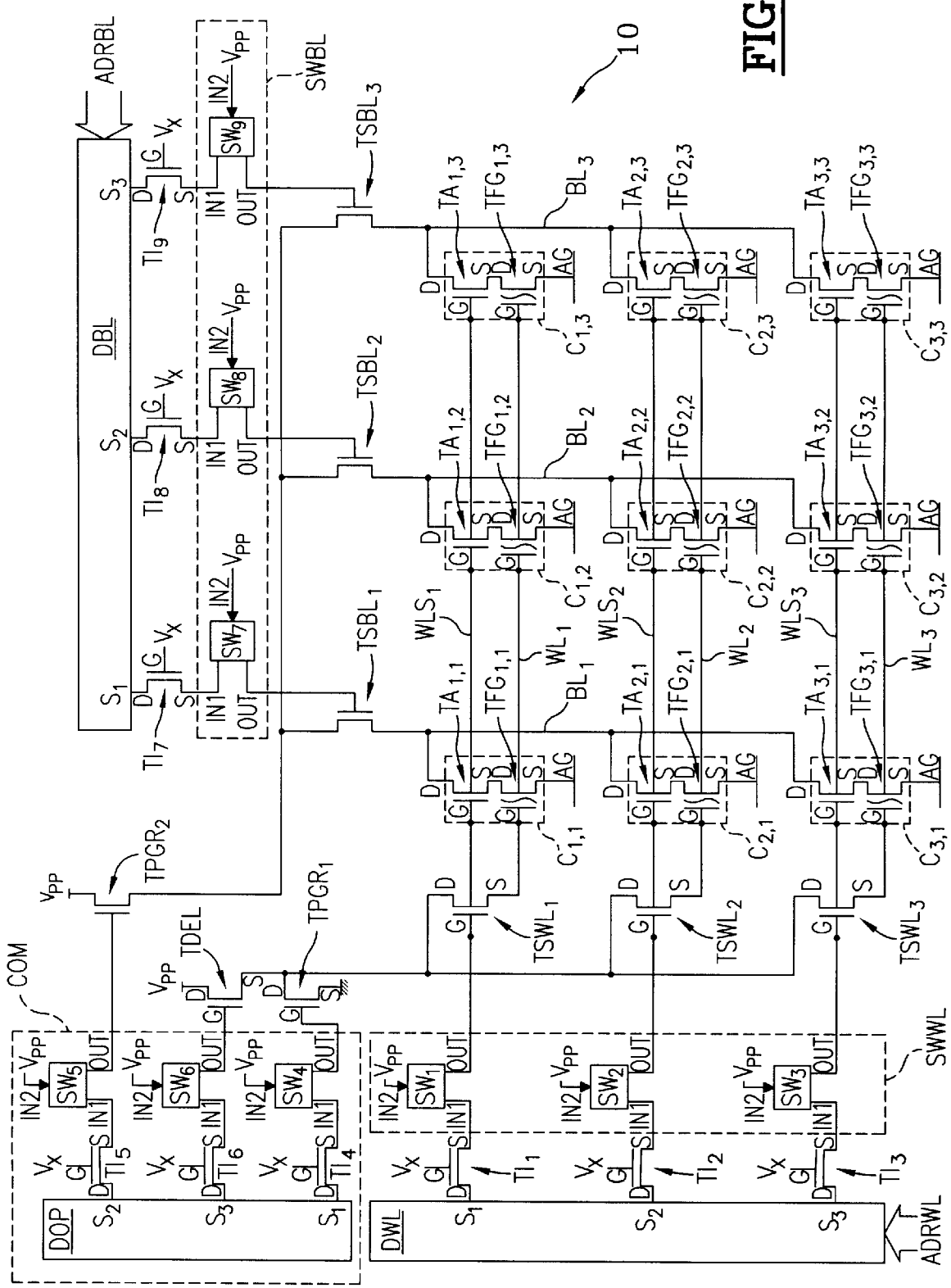
Figure 5:
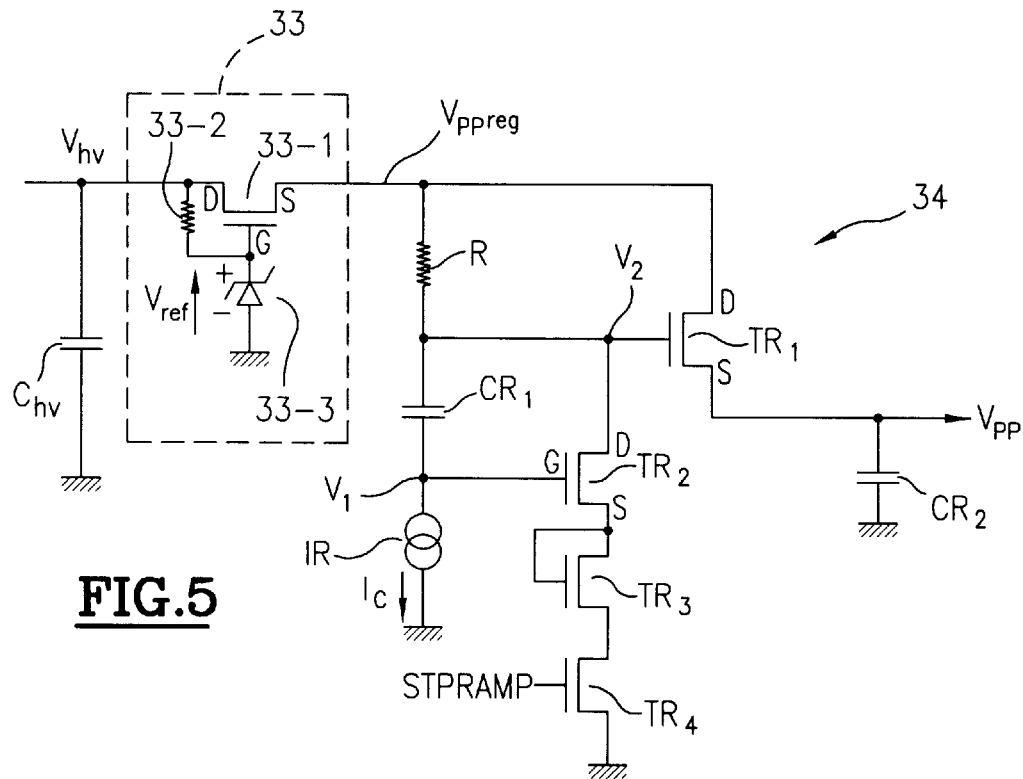
Figure 6:
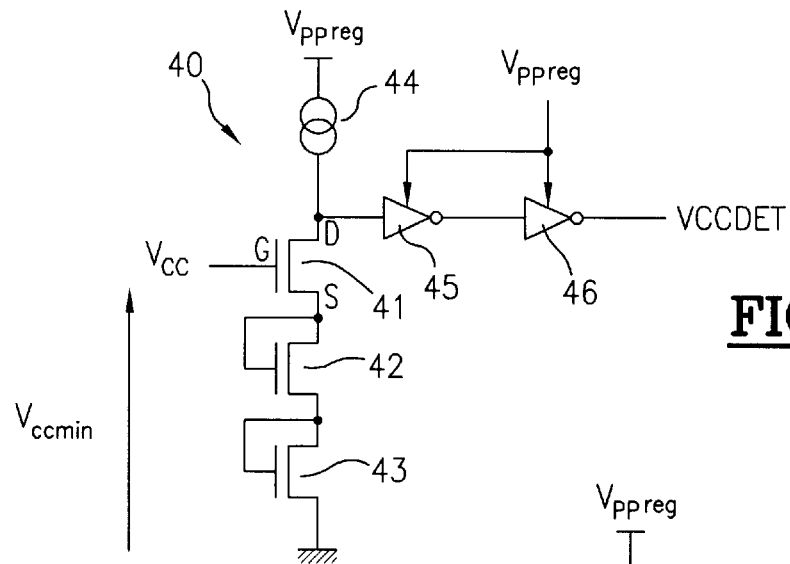
Figure 7:
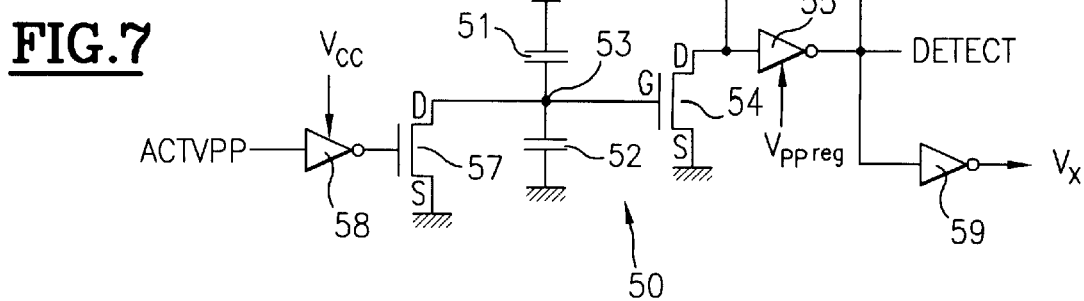
Figure 8:
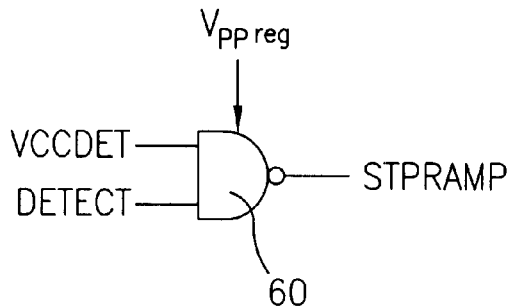
Figure 9:
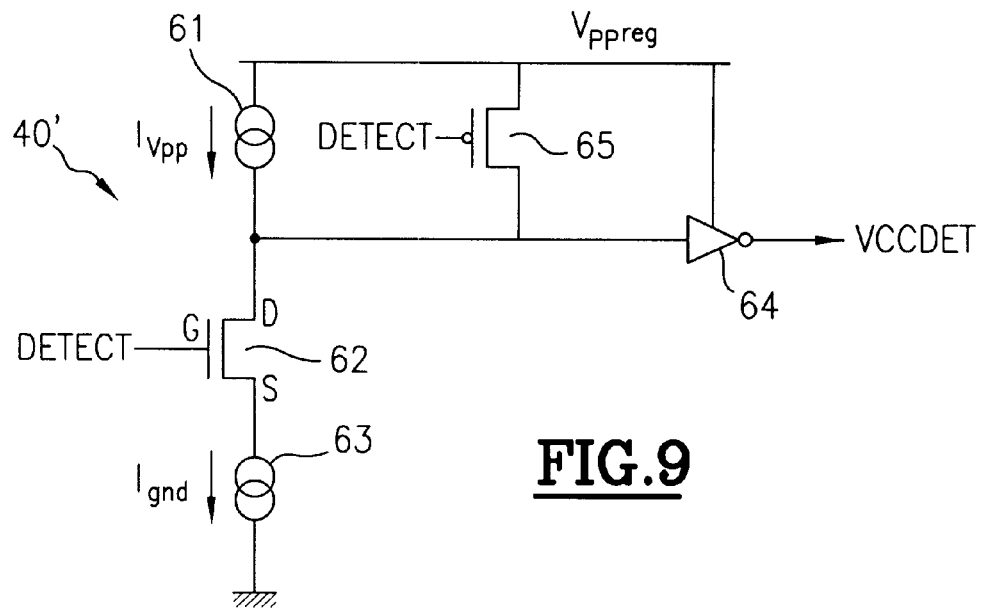
Figure 10:
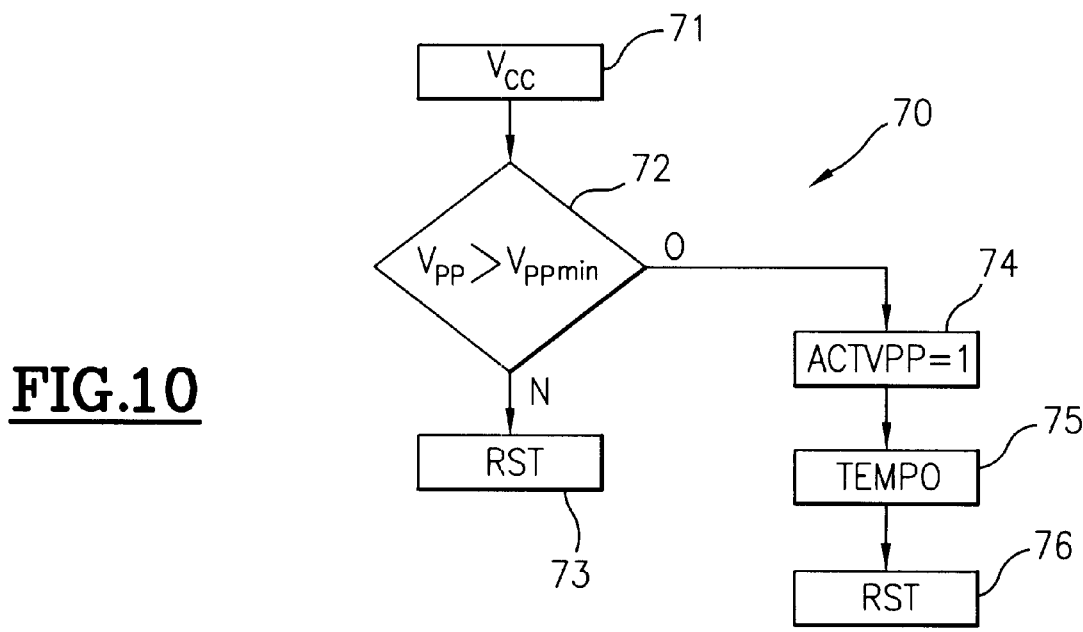

These characteristics, advantages as well as others of the present invention will be described with more details in the following description of the method of the invention and of an embodiment of an EEPROM memory according to the invention, in conjunction with the accompanying drawings, in which:

FIG. 1, already described, represents, in block form, the general architecture of a microcircuit provided with an EEPROM memory, FIG. 2 represents the graph of a programming or erasing high voltage of an EEPROM memory, having the aspect of a ramp, FIG. 3 is the electrical diagram of an EEPROM memory according to the invention, FIG. 4 represents in a more detailed way a switching element of the memory of FIG. 3, FIG. 5 is the electrical diagram according to the invention of a circuit generating the voltage ramp of FIG. 2, FIG. 6 is the electrical diagram of a circuit for detecting a supply voltage failure according to the invention, FIG. 7 is the electrical diagram of a circuit for detecting a programming or erasing high voltage, according to the invention, FIG. 8 is the logic diagram of a circuit providing a signal inhibiting the ramp generating circuit of FIG. 5, FIG. 9 represents an alternative embodiment of the detecting circuit of FIG. 6, and FIG. 10 is a flow chart representing the working of a microcircuit comprising a memory according to the invention.

To reduce the risks of recording erroneous data into an EEPROM memory 10 of the type already described in conjunction with FIG. 1, the present invention provides technical arrangements allowing to ensure that a programming or erasing operation which has started will end, even if the supply voltage Vcc disappears. More particularly, the present invention provides the following arrangements:

(A) maintaining the path forwarding the high voltage Vpp to the memory cells $C_{i,j}$ when the supply voltage Vcc is lacking, (B) maintaining the high voltage Vpp at least during the time necessary for the programming or erasing operation. For this purpose, a capacity external to the silicon chip where the memory is integrated could be used, but this would mean an industrial drawback, in particular for manufacturing chip cards or electronic labels. Preferably, the present invention provides to maintain the high voltage by means of capacitive elements which are already present in the chain 30 for producing the high voltage Vpp, in particular by means of the already described stabilising capacity Chv.

(C) inhibiting or switching off the elements of the chain 30 for producing the high voltage Vpp which could consume current. This last arrangement, which is optional, allows decreasing the value of the capacitive elements which maintain the voltage Vpp and, therefore, their size.

First of all, an embodiment of an EEPROM memory corresponding to arrangement A will be described.

Arrangement A: maintaining the path forwarding the high voltage Vpp

FIG. 3 represents in a detailed way an embodiment according to the present invention of the EEPROM memory 10 whose general architecture has already been described in conjunction with FIG. 1. For the sake of simplicity, the memory 10 as represented comprises only six memory cells $C_{i,j}$, arranged in rows and columns, the indexes i and j having values from 1 to 3 and representing respectively the row and column number of each cell $C_{i,j}$.

In a conventional way, each memory cell $C_{i,j}$ comprises an access transistor $TA_{i,j}$ and a floating gate transistor $TFG_{i,j}$ connected, by its drain D, to the access transistor $TA_{i,j}$. Each floating gate transistor $TFG_{i,j}$ is connected, by its source S, to a conductive line AG. The conductive line AG, which is shared by all the other floating gate transistors, is brought to a floating potential during the programming operations and to the potential 0 (ground) during the erasing operations. The gates G of the floating gate transistors $TFG_{i,j}$ of a same row (same index i) are connected, by a common conductive line $WL_i$ ($WL_1$, $WL_2$, $WL_3$), to the source S of a row selecting transistor $TSWL_i$ ($TSWL_1$, $TSWL_2$, $TSWL_3$). The gates G of the access transistors $TA_{i,j}$ of the cells of a same row are connected by means of a common conductive line $WLS_i$ ($WLS_1$, $WLS_2$, $WLS_3$) to the gate of the row-selecting transistor $TSWL_i$. The drains D of the row selecting transistors $TSWL_i$ are all connected to the drain D of a programming transistor $TPGR_1$ and to the source S of an erasing transistor TDEL. The source S of the programming transistor $TPGR_1$ is connected to ground and the erasing transistor TDEL receives the high voltage Vpp on its drain D when the chain 30 of FIG. 1 is activated. Furthermore, the drains D of the access transistors $TA_{i,j}$ of a same column are connected, by means of a common conductive line $BL_j$ ($BL_1$, $BL_2$, $BL_3$), to the source S of column selecting transistor $TSBL_j$ ($TSBL_1$, $TSBL_2$, $TSBL_3$). Lastly, the drains D of the column selecting transistors $TSBL_j$ ($TSBL_1$, $TSBL_2$, $TSBL_3$) are all connected to the source S of a programming transistor $TPGR_2$ whose drain D receives the high voltage Vpp.

According to the invention, the gates G of the transistors enabling the forwarding of the voltage Vpp to the memory 10, the selection of the cells $C_{i,j}$ and the ground connection, here the row selecting transistors $TSWL_1$, $TSWL_2$, $TSWL_3$, programming transistors $TPGR_1$, $TPGR_2$, erasing transistor TDEL and column selecting transistors $TSBL_1$, $TSBL_2$, $TSBL_3$, are driven by memory switches, respectively $SW_1$, $SW_2$, $SW_3$, $SW_4$, $SW_5$, $SW_6$, $SW_7$, $SW_8$, $SW_9$, which maintain the voltage Vpp or the 0 voltage (ground) on their outputs OUT even if the supply voltage Vcc vanishes. Each SWitch $SW_i$ comprises an output OUT connected to the gate of one of the above-mentioned transistors, a control input IN1, and a supply input IN2 which receives the high voltage Vpp. The control inputs IN1 of the switches $SW_1$, $SW_2$, $SW_3$ are driven by outputs S1, S2, S3 of the row decoder DWL through isolating transistors $TI_1$, $TI_2$, $TI_3$. The control inputs IN1 of the switches $SW_4$, $SW_5$, $SW_6$ are driven by outputs S1, S2, S3 of an operation decoder DOP through isolating transistors $TI_4$, $TI_5$, $TI_6$. Lastly, the control inputs IN1 of the switches $SW_7$, $SW_8$, $SW_9$ are driven by outputs S1, S2, S3 of the column decoder DBL through isolating transistors $TI_7$, $TI_8$, $TI_9$ (to establish correspondence with the general architecture represented in FIG. 1, the switch units SWWL and SWBL and the operation selecting circuit COM have been delimited by a dotted line in FIG. 3). Here, the isolating transistors $TI_1$ to $TI_9$ are MOS transistors whose gate G is controlled by a signal Vx which will be described later.

FIG. 4 represents an embodiment of a memory switch $SW_i$ according to the invention. The switch comprises two inverting gates $INV_1$, $INV_2$ which are disposed head to foot and supplied by the high voltage Vpp. The output of the gate $INV_1$ forms the output OUT of the switch $SW_i$ and is fed back to the input of the gate $INV_2$. The output of the gate $INV_2$ forms the control input IN1 of the switch and is fed back to the input of the gate $INV_1$. The inverting gates $INV_1$, $INV_2$ are here of the CMOS type and comprise each a PMOS transistor $TSW_1$, respectively $TSW_3$, and a NMOS transistor $TSW_2$, respectively $TSW_4$, the high voltage Vpp being applied to the sources S of the PMOS transistors. It can be seen that the closed loop structure of the switches $SW_i$ enables to maintain indefinitely the state of their output OUT, as long as the voltage Vpp is present. Furthermore, the state of the output OUT can be changed by a reverse control on the input IN1, the switches being here inverters for reasons of design simplicity. However, it can be noted that the switches $SW_i$ could be designed as non-inverters, for example by means of four closed loop inverting gates or by any electronic arrangement within the skills of the man skilled in the art.

To perform a programming or erasing operation of cells $C_{i,j}$ of the memory 10, the output OUT of some switches $SW_i$ must be set to 1 (that is to the voltage Vpp) and remain in that state, even in the case of a failure of the supply voltage Vcc. Let's consider as a matter of example in conjunction with FIG. 3 again that it is wished to programme (that is to set to the logic state "1") the cell $Cl_$. The transistors $TSWL_1$, $TA_{1,1}$ and $TSBL_1$ have to be turned ON in order to select the cell $C_{1,1}$. The transistor $TPGR_2$ must be turned ON to forward the voltage Vpp to the drain D of the floating gate transistor $TFG_{1,1}$, and the transistor $TPGR_1$ must be turned ON in order to apply to ground the gate G of the transistor $TFG_{1,1}$ and to perform the charge transfer by tunnel effect in the transistor $TFG_{1,1}$. Thus, the following operations must be performed:

(i) starting of the high voltage Vpp production chain shown in FIG. 1, (ii) setting to 0 the output S1 of the row decoder DWL, of the outputs S1 and S2 of the operation decoder DOP and of the output S1 of the column decoder DBL, all the other decoder outputs being at 1, that is at the voltage Vcc, the decoders being supplied by the voltage Vcc in a conventional manner.

(iii) the signal Vx is set to 1 and the isolation transistors $TI_i$ are turned ON in order that the outputs of the decoders DWL, DOP, DBL drive the inputs IN1 of the memory switches $SW_1$ to $SW_9$. At the end of this step, the voltage Vpp (the logic "1" of the switches $SW_i$) is present on the outputs OUT of the switches $SW_1$, $SW_4$, $SW_5$ and $SW_7$ and at the inputs IN1 of the switches $SW_2$, $SW_3$, $SW_6$, $SW_8$, $SW_9$ whose outputs OUT are at ground (logic "0"). The voltage Vpp being present on the inputs IN1 of the switches $SW_2$, $SW_3$, $SW_6$, $SW_8$, $SW_9$, the source S of the corresponding isolating transistors $TI_2$, $TI_3$, $TI_6$, $TI_8$, $TI_9$ is at a higher potential than their drains D which are at the voltage Vcc, and these transistors are in an OFF state, isolating therefore the voltage Vpp from the voltage Vcc.

Once these operations having been performed, the transistors $TSWL_1$, $TA_{1,1}$, $TPGR_1$, $TPGR_2$ and $TSBL_1$ receive the voltage Vpp on their gates G and are in an ON state. The voltage Vpp is forwarded to the drain D of the floating gate transistor $TFG_{1,1}$ by means of the transistors $TSBL_1$ and $TPGR_2$. The gate G of $TFG_{1,1}$ is connected to ground by means of the transistors $TPGR_1$ and $TSWL_1$. The usual charge transfer process by tunnel effect in the floating gate of the transistor $TFG_{1,1}$ starts and has to be carried on during some milliseconds.

Advantageously, if the voltage Vcc fails during the programming process and if the outputs of the decoders DWL, DOP, DBL become 0 because the electrical supply is lacking, the switches $SW_i$ keep the state of their output OUT as long as the voltage Vpp is present, and the forwarding of the voltage Vpp is maintained. Furthermore, the transistor $TPGR_1$ which assumes the forwarding of the voltage 0 (ground) is controlled by the switch $SW_4$ and remains in an ON state as long as the voltage Vpp exists. In the prior at, such a transistor was controlled directly by the voltage Vcc, such that a failure of the voltage Vcc implied the breaking of the way leading to ground. Lastly, the advantages of the invention are also found in the erasing operations (switching to the logic state "0" of a row of cells $C_{i,j}$) which require to turn ON the transistor TDEL as well as the transistor $TSWL_i$ of the row to erase.

The first object of the invention being achieved, what is necessary has to be done to ensure the maintaining of the voltage Vpp during the time required by a programming or erasing operation. As a secondary object of the present invention is neither to increase in an unacceptable manner the size of the capacity used for this, nor to use an external capacity, it will first be done what is necessary in order that the current which is consumed in the case of a failure of the voltage Vcc should be as low as possible (arrangement C).

Arrangement C: switching off or inhibiting some elements

In the case of the chain 30 shown in FIG. 1, the only elements capable to discharge the capacity which maintains the voltage Vpp are the regulator 33 and the ramp generator 34, whose working generally implies the consumption of a small current. In fact, the oscillator 31 and the pump charge 32 (or any other booster circuit) stop working when the voltage Vcc disappears.

FIG. 5 shows a particularly simple embodiment of a set comprising a regulator 33 and a ramp generator 34 which does not consume current when a failure of the supply voltage Vcc occurs, the ramp generator 34 being able to be inhibited by a signal STPRAMP.

The regulator 33 comprises, in a conventional way, a MOS transistor 33-1 whose gate G is fed back to the drain by means of a resistor 33-2. The gate G of the transistor 33-1 is biased by a zener diode 33-3 providing a reference voltage Vref. The voltage at the output of the regulator 33 will be called Vppreg.

At the input of the ramp generator 34, the voltage Vppreg is applied to the drain D of a transistor $TR_1$ and to the end of a resistor R. The other end of the resistor R is connected to the gate G of the transistor $TR_1$ and to the anode of a capacity $CR_1$. The cathode of the capacity $CR_1$ is connected to the gate G of a transistor $TR_2$ and to a current source IR which imposes a charging current Ic of low value to the capacity $CR_1$. The transistor $TR_2$ has its drain D connected to the gate G of the transistor $TR_1$. Its source S is connected to ground by means of a transistor $TR_3$ which works as a diode (gate fed back to drain) arranged in series with a transistor $TR_4$. The gate G of the transistor $TR_4$ is controlled by a signal STPRAMP which is set to 0 when the supply voltage fails. The output of the ramp generating circuit 34 is taken on the source S of the transistor $TR_1$ and is regulated by a capacity $CR_2$.

When the signal STPRAMP is at 1 (the transistor $TR_4$ is ON) and the voltage Vppreg rises rapidly at the input of the circuit 34 (the charge pump 32 being activated by the oscillator 21), the voltage V1 which is present on the cathode of the capacity $CR_1$ increases rapidly because the charging current Ic is chosen small enough so that the capacity $CR_1$ cannot absorb quickly the voltage variation due to the presence of the voltage Vppreg. When the voltage V1 becomes higher than the value 2VT, VT being the threshold voltage of the transistors $TR_2$, $TR_3$, the transistor $TR_2$ turns ON and slows down the increase of the voltage V2 which is present on the gate of the transistor $TR_1$. Due to the charge of the capacity $CR_1$, the voltage V2 increases slowly till it reaches the value Vppreg. The voltage Vpp is equal to the voltage V2 to which the threshold voltage VT of the transistor $TR_1$ is subtracted. The graph of the voltage Vpp, represented in FIG. 2, shows a first part with the form of a ramp, followed by a flat zone where Vpp is equal to its maximal value Vppmax :

(1) Vppmax=Vppreg-$VT$

VT designating here the threshold value of the transistor $TR_1$.

It can be seen that the current consuming during the ramp generation is due mainly to the transistors $TR_2$, $TR_3$, $TR_4$ and to the current passing through the zener diode 33-3 of the regulator 33. When the signal STPRAMP is set to 0, the transistor $TR_4$ and therefore the transistors $TR_2$ and $TR_3$ are no more conductive and consume no more. The capacity $CR_1$ is rendered floating and the voltage V2 on the gate of the transistor $TR_1$ rises quickly to the voltage Vppreg. The electrical charges stored in the capacity Chv are transferred into the capacity $CR_2$, the zener diode 33-3 is blocked and the voltage Vpp reaches its maximal value Vppmax in a very short time, as shown with a dotted line in FIG. 2.

Arrangement B: maintaining the voltage Vpp

In the following lines, it will be shown that the internal capacities of the chain 30, here the capacities Chv, $CR_1$, $CR_2$, can assume alone the maintaining of the high voltage Vpp without making necessary an unacceptable increase of the silicon area take up by these capacities.

By reference again to FIG. 5, it can be seen that, when the signal STPRAMP is set to 0, the capacity Chv at the output of the charge pump 32 must be capable to ensure the transfer of its electrical charge to the capacity $CR_2$, in order that the volta ge Vpp reaches rapidly a value Vprog which is sufficient to assume the continuation of the started programming or erasing process. In the specific embodiment which has just been given, the whole charge Q1 which is stored in the chain 30, at the moment when STPRAMP switches to 0, is equal to:

(2) Q1=$Vhv$ $Chv$+$K$ Vppreg $CR_1$+(Kvppreg-$VT$) $CR_2$ (KVppreg-VT) being the value of the voltage Vpp when the supply voltage Vpp fails, K being a parameter comprised between 0 and 1, and VT being the threshold voltage of the transistor $TR_1$.

After the charge transfer, the voltage Vhv on the terminals of Chv is about equal to Vppreg, the transistor 33-1 of the regulator 33 behaving as a simple diode, the zener diode 33-3 being no more conducting. If the charge transfer has occurred accurately, the total charge Q1 can then be written:

(3) Q1=Vprog ($Chv$+$CR_1$+$CR_2$)-$VT$ $CR_2$

Vprog designating the final value of the programming voltage Vpp after the charge transfer.

By combining the equations (2) and (3), it is educed that:

(4) $Chv$=(Vprog-$K$ Vppreg) ($CR_1$+$CR_2$)/[$Vhv$-Vprog]

Once the programming voltage Vprog has been chosen, the determination of the capacity Chv is a matter of practice within the skills of the man skilled in the art. It must be taken into account that, in spite of the care which has just been taken, leaking currents that are inherent in integrated circuit technology will remain. For example, if the following values are chosen:

$CR_1$=5 pF, $CR_2$=3 pF,

Vhv=22 V,

Vppreg=20 V,

Vprog=19 V, and if it is assumed that the charge transfer is performed at 75% of the voltage ramp, K being equal to 0.75, the equation (4) gives a minimal value of Chv equal to 10.6 pF, which means, with the capacities $CR_1$ and $CR_2$, an overall equivalent capacity of about 18 pF for the whole chain 30. In presence of a leaking current of 10 nA, such a capacity allows to maintain the voltage Vprog during 1.8 milliseconds with a voltage decrease of 1V only at the end of this period, which is sufficient to ensure a good programming.

Optimisation of the size of the capacity Chv

It results from the equation (4) that the value of the capacity Chv which is necessary for transferring the charges is all the higher as the term K is small. Thus, if it is desired that the capacity Chv has a low value and a small size while allowing the charge transfer to the capacity $CR_2$, the term K must be close to 1 and the failure of the voltage Vcc has preferably to occur at a moment when the voltage Vpp is the nearest to its maximal value Vppmax.

Here, an idea of the present invention is not to deliver the signal STPRAMP when the voltage Vpp has a value below an efficiency threshold Vppmin from which the voltage Vpp begins to act on the memory cells $C_{i,j}$. Typically, the threshold Vppmin is about 15V for EEPROM memories using floating gate transistors. This optional aspect of the present invention enables to optimise the size of the capacity Chv and, on the other hand, to avoid the transfer of the charge of the capacity Chv when a programming or erasing operation has not really started in spite of the activation of the production chain 30 of the voltage Vpp.

FIGS. 6, 7 and 8 represent circuits enabling the generation of the signal STPRAMP in the conditions which have just been mentioned. The circuit 40 of FIG. 6 is a circuit which detects failures of the voltage Vcc, and produces a failure signal VCCDET. The circuit 50 of FIG. 7 enables the generation of a signal DETECT when the voltage Vpp reaches the efficiency threshold Vppmin. Lastly, FIG. 8 shows a logic circuit which combines VCCDET and DETECT to produce the signal STPRAMP. In a general way, it will be noticed that most of the logic gates used in the design of the circuits of FIGS. 6, 7, 8 are supplied with the voltage Vppreg, in order not to be affected by a failure of the voltage Vcc. Preferably, these logic gates are implemented by means of CMOS technology in order not to consume current out of the commutation periods.

The circuit 40 of FIG. 6 comprises a MOS transistor 41, which receives the supply voltage Vcc on its gate G. The source S of the transistor 41 is connected to ground by means of two MOS transistors 42, 43 arranged in series and operating as diodes. The drain D of the transistor 41 is coupled to the voltage Vppreg by means of a current source 44, as well as to the input of an inverting gate 45. The output of the gate 45 feeds the input of a second inverting gate 46 which delivers the signal VCCDET. The signal VCCDET switches to 1 when the voltage Vcc becomes lower than a threshold value Vccmin which is equal to the sum of the threshold voltages of the transistors 41, 42, 43. Vccmin will be for example chosen equal to 3V.

The circuit 50 of FIG. 7 comprises a bridge which divides the voltage Vpp and is composed by two capacities 51, 52. The mid-point 53 of the dividing bridge is connected to the gate G of a MOS transistor 54. The capacities 51 and 52 are chosen so that the mid-point voltage is equal to the threshold voltage VT of the transistor 54 when the voltage Vpp reaches its efficiency value Vppmin. The source S of the transistor 54 is connected to ground and its drain D is connected to the input of an inverting gate 55 whose output delivers the signal DETECT. The logic state of the gate 55 is stabilised by a MOS transistor 56 of the P type supplied by the voltage Vppreg. Lastly, a MOS transistor 57 controlled by the signal ACTVPP by means of an inverting gate 58 couples the mid-point 53 of the dividing bridge to ground. Thus, when the signal ACTVPP is 0, that is out of the activation periods of the chain 30 which produces the voltage Vpp, the circuit 50 is disabled, the output DETECT is at 0. When ACTVPP is set to 1, the voltage at the mid-point 53 increases till it reaches the threshold voltage VT of the transistor 54. At this moment, the voltage Vpp is equal to Vppmin, the transistor 54 turns ON and the signal DETECT switches to 1.

As can be seen on FIG. 8, the signals VCCDET and DETECT are combined by a logic gate 60 of the NAND type, whose output delivers the signal STPRAMP. In order that the signal STPRAMP switches to 0 and inhibits the ramp generating circuit 34 of FIG. 5, it is necessary that VCCDET and DETECT are both at 1.

Furthermore, referring again to FIG. 7, it can be seen that the signal DETECT can be used to produce the signal Vx which controls the isolating transistors TI$_i$ of the memory 10 (FIG. 3). The signal Vx is delivered by an inverting gate 59 which receives the signal DETECT on its input and switches thus to 0 when the voltage Vpp reaches the efficiency threshold Vppmin. The advantage is that the signal Vx is automatically reset and the isolating switches Ti definitively closed when the signal DETECT switches to 1. Thus, in the case of a further failure of the voltage Vcc, no reverse current capable to pass through the switches Ti when the signal Vx is not 0 will be able to appear.

FIG. 9 represents an alternative 40' of the circuit 40 of FIG. 6. The circuit 40' detects failures of the voltage Vcc by monitoring the voltage Vppreg at the output of the regulator 33, instead of monitoring the voltage Vcc itself. The advantage is to be free from micro-failures or fluctuations of the voltage Vcc having a too short duration to justify starting the protection mechanism according to the invention. A first current source 61 which delivers a current Ivpp is arranged between the output of the regulator 33 and the drain D of an NMOS transistor 62 which receives the signal DETECT on its gate G. The source S of the transistor 62 is coupled to ground by means of a second current source 63 which delivers a current Ignd. The drain D of the transistor 62 feeds the input of an inverting gate 64 which is supplied by the voltage Vppreg and delivers the signal VCCDET. Lastly, an NMOS transistor 65, controlled by the signal DETECT, is arranged between the voltage Vppreg and the input of the inverting gate 64. The current sources 61 and 63 are adjusted so that the current Ivpp is greater than the current Ignd when the voltage Vppreg is at its normal value Vregnom. When the signal DETECT switches to 1, the transistor 62 is ON, the current Ivpp exceeds the current Ignd and the voltage on the drain D of the transistor 62 is close to Vppreg. If the voltage Vppreg decreases, in particular due to a failure of the supply voltage Vcc, the current Ivpp decreases, the voltage of the drain D drops and causes the switching of the inverting gate 64 whose output VCCDET switches to 1. On the other hand, when the signal DETECT is at 0, the circuit 40' is blocked and the transistor 65 sets the signal VCCDET to 0. Thus, the signal VCCDET cannot switch to 1 as long as the signal DETECT is not at 1. The NAND gate of FIG. 8 becomes thus useless, the inverse signal/VCCDET of the signal VCCDET being able to be used as signal STPRAMP.

In the foregoing, it has been dealt with the protection of an EEPROM memory which is integrated in a microcircuit 1 comprising various functions, which are symbolically represented by the logic circuit 20. In the field of chip cards, these functions are for example the management of transaction operations, performing enciphering operations which enable the fight against fraud, etc., the EEPROM memory being used by the microcircuit 1 as a data recording and storing means. However, it is obvious that the present invention may be applied to a microcircuit 1 which does not comprise the logic circuit 20, that is a mere EEPROM microcircuit, the decoders DWL, DOP, and DBL being able to be controlled from outside.

When the microcircuit 1 comprises the functions which have just been evoked, the carrying out of the invention may, in some applications, present a difficulty linked to the existence of microfailures of the voltage Vcc, whose duration is less than the duration of a programming or erasing operation. In fact, if the logic circuit 20 is systematically reset (set to 0) when switching on, as it is common in the prior art, it can happen that the logic circuit 20 initiates a new programming operation or a reading operation of the memory while a programming operation started before the microfailure has not ended yet. In this case, the present invention provides the following complementary arrangements:

(D) providing a temporisation step at least equal to the duration of a programming or erasing operation when the supply voltage Vcc appears. After this temporisation step, the logic circuit 20 can be reset.

(E) the temporisation step is performed only if the high voltage Vpp is present at the output of the chain 30. This alternative of arrangement D may consist in determining if the capacity Chv is in a charged or a discharged state before carrying on the temporisation step. In fact, when the microcircuit 1 "wakes up" when the voltage supply Vcc is switched on, it does not know if the presence of Vcc follows a microfailure or a long duration cut-off. To check the presence of Vpp or Vhc allows to get rid advantageously of this doubt. A simple way to perform this checking consists in reading the output of the circuit 50 of FIG. 7. If the signal DETECT is at 1, the reset of the logic circuit 20 must be temporised.

(F) the chain 30 producing of the voltage Vpp is activated during the temporisation. This arrangement is an improvement of the arrangements D and E. In fact, if the voltage Vpp is not zero when switching on the voltage (for example because the signal DETECT is a 1), it can be advantageous to restart the working of the charge pump 32 instead of letting the capacities Chv and CR2 (FIG. 5) assume alone the end of the current programming or erasing operation;

This working mode of the microcircuit 1 is illustrated by the flowchart 70 of FIG. 10. When the voltage Vcc is switched on (step 71), the logic circuit 20 checks if the voltage Vpp is present (step 72). This checking may consist in checking if the voltage Vpp is higher than Vppmin, for example by means of the signal DETECT. If the result of the checking is Yes, the circuit 20 activates the chain 30 (step 74, ACTVPP=1) and waits for some milliseconds (step 75, TEMPO). Then, the circuit 20 generates its own reset (step 76, RST). If the checking of step 72 is negative, the circuit 20 resets immediately after it is supplied (step 73, RST).

In the foregoing, an example of carrying out the present invention has been described, which is linked to a specific structure of an EEPROM memory using floating gate transistors and to a specific structure of the chain producing the high voltage Vpp. The man skilled in the art will, from the information and examples given here, apply the invention to other types of EEPROM memories, insofar as these memories do not consume current during the programming or erasing periods, which is normally always the case.

Furthermore, the ramp generating circuit 34 may be unnecessary, depending on the type of EEPROM memory which is used. It must be recalled that to apply a voltage ramp Vpp to the memory cells has only for purpose the protection of the cells against slow damages, which could be caused by applying abruptly the voltage Vpp at each programming or erasing operation. This voltage ramp can be proved to be necessary with some types of cells, in particular with these using floating gate transistors. However, such a voltage ramp is not imperative for programming. Moreover, the man skilled in the art will note the fact that cutting off this voltage ramp in the exceptional cases when the present invention takes place has no significant incidence on the life time of the cells. Lastly, the use of a charge pump is not imperative, as the man skilled in the art knows other ways to design booster circuits.

We claim:

1. Electrically erasable and programmable memory (10) having means (30) for producing a programming or erasing high voltage (Vpp) from a supply voltage (Vcc), comprising:

a capacitance (Chv, $CR_2$) for maintaining the high voltage (Vpp) in the case of a failure of the supply voltage (Vcc), and memory switching means ($SW_i$) supplied by the high voltage (Vpp), for maintaining, in the case of a failure of the supply voltage (Vcc), the high voltage (Vpp) to memory cells ($C_{i,j}$) in the process of being programmed or erased for a duration necessary to complete said process.

2. Memory according to claim 1, comprising:

memory switching means ($SW_i$) for controlling transistors ($TPGR_1$, $TPGR_2$) to provide the high voltage (Vpp) to the memory cells, for controlling transistors ($TWSL_i$, $TSBL_i$) for selecting memory cells, and for controlling ground connecting transistors ($TPGR_1$).

3. Memory according to claim 2, wherein said memory switching means ($SW_i$) comprise at least two closed loop inverting gates (INV1, INV2) supplied by the high voltage (Vpp) and controlled by means of isolating transistors ($TI_i$).

4. Memory according to claim 1, wherein said capacitance for maintaining the high voltage (Vpp), comprises a stabilizing capacity (Chv) in said means (30) for producing the high voltage.

5. Memory according to claim 1, wherein said high voltage (Vpp) is applied by means of a circuit (34) generating a ramp (Vpp), comprising means ($TR_4$, 40, 40', 50, 60) for inhibiting said ramp generating circuit (34) in the case of failure of the supply voltage (Vcc).

6. Memory according to claim 5, wherein said means ($TR_4$, 40, 50, 60) for inhibiting the ramp generating circuit (34) comprise:

a circuit (40, 40') for detecting failures of the supply voltage (Vcc), which is activated when a supply voltage failure is detected, a circuit (50) for monitoring the voltage (Vpp) at the output of the ramp generating circuit (34) which is activated (DETECT) when the ramp voltage (Vpp) reaches an efficiency threshold (Vppmin), the ramp generating circuit (34) being inhibited when both circuits are activated.

7. Memory according to claim 6, wherein the circuit (40) for detecting failures of the supply voltage (Vcc) monitors the supply voltage and is activated when the supply voltage drops below a predetermined threshold voltage (Vccmin).

8. Memory according to claim 6, wherein the circuit (40') for detecting supply voltage failures monitoring a high voltage (Vppreg) applied to the ramp generating circuit (34) and is activated when the high voltage (Vppreg) is below a predetermined value (Vregnom).

9. Memory (1) comprising a memory (10) according to claim 1 and a logic circuit (20) using the memory (10) as means for storing data.

10. Memory according to claim 9, wherein, the starting of the logic circuit (20) is delayed for a time interval of about the duration of a programming or erasing operation of the memory (10) when the supply voltage (Vcc) is applied.

11. Memory according to claim 10, wherein the starting of the logic circuit (20) is delayed provided that the high voltage (Vpp) is present at the output of the means (30) for producing the high voltage (Vpp).

12. Method of reducing the risks of writing erroneous data into an electrically erasable and programmable memory (10) when a failure of the supply voltage (Vcc) of said memory (10) occurs during a programming or erasing operation of memory cells ($C_{i,j}$), the memory (10) including means (30) for producing a programming or erasing high voltage (Vpp), comprising the steps of:

providing an electrical capacitance (Chv, $CR_2$) for maintaining the high voltage (Vpp), in the case of a failure of the supply voltage (Vcc), during the time which is necessary for the programming or erasing operation, and providing memory switching means ($SW_i$) supplied by the high voltage (Vpp), to maintain, in the case of a failure of the supply voltage (Vcc), the application of the high voltage (Vpp) to memory cells ($C_{i,j}$) in the process of being programmed or erased.

13. Method according to claim 12, wherein said capacitance comprises at least a stabilizing capacitance (Chv, $CR_2$) in the means (30) for producing the high voltage (Vpp).

14. Method according to claim 12, wherein memory switching means ($SW_i$) controls transistors ($TPGR_1$, $TPGR_2$) for forwarding the high voltage (Vpp), controls transistors ($TSWL_i$, $TSBL_i$) for selecting memory cells, and controls ground connecting transistors ($TPGR_1$).

15. Method according to claim 12, further comprising the step of:

switching off or inhibiting memory circuits (34) to conserve current.

16. Method according to claim 12, wherein the high voltage (Vpp) applied to the memory cells is maintained provided that the high voltage (Vpp) applied to the memory

(10) presents a value greater than or equal to an efficiency threshold (Vppmin) at the moment when a failure of the supply voltage (Vcc) occurs.

17. Method according to claim 12, wherein the detection of the supply voltage (Vcc) failure further comprises the step of:

determining if the supply voltage is below a predetermined threshold (Vccmin).

18. Method according to claim 12, wherein the detection of the supply voltage (Vcc) failure further comprises the step of:

determining if a voltage (Vppreg) present in the means (30) for producing the high voltage (Vpp) is below its normal value (Vregnom).

* * * * *